United States Patent [19]
Butler et al.

[11] Patent Number: 5,429,704
[45] Date of Patent: Jul. 4, 1995

[54] ETCHING TOOL

[75] Inventors: Charles A. Butler; Jon Gwin, both of San Antonio, Tex.

[73] Assignee: Sony Electronics, Inc.

[21] Appl. No.: 153,404

[22] Filed: Nov. 16, 1993

[51] Int. Cl.⁶ .............................................. C23F 1/02
[52] U.S. Cl. .................................... 156/345; 216/54
[58] Field of Search ............... 156/633, 644, 646, 345

[56] References Cited

U.S. PATENT DOCUMENTS

| | | | |
|---|---|---|---|
| 5,173,152 | 12/1992 | Tanaka | 156/646 |
| 5,174,855 | 12/1992 | Tanaka | 156/626 |
| 5,256,594 | 10/1993 | Wu | 437/89 |

*Primary Examiner*—R. Bruce Breneman
*Assistant Examiner*—Joni Y. Chang
*Attorney, Agent, or Firm*—Pasquale Musacchio; Jerry A. Miller

[57] ABSTRACT

A tool for etching at least one selected area of a silicon dixoide layer on a wafer. The tool includes a container which is partially filled with hydrofluoric (HF) acid. The tool further includes a template having an aperture extending between each selected area and the container. Vapors of the HF acid pass through each aperture to contact and etch each selected area in order to expose a test die on the wafer. An O-ring is associated with each selected area for sealing each of the selected areas from the remaining areas on the silicon dioxide layer such that substantially only the selected areas are etched by the vapors.

17 Claims, 5 Drawing Sheets

ETCHING TOOL

FIELD OF THE INVENTION

This invention relates to the manufacture of integrated circuits, and more particularly, to a tool for etching selected areas of at least one layer formed on a substrate.

BACKGROUND OF THE INVENTION

An integrated circuit (IC) is typically manufactured by a process which utilizes planar technology. Generally, this process includes growing a layer of silicon dioxide on a silicon wafer. Selected areas of the silicon dioxide layer are then removed by an etching procedure in which the selected areas are exposed to hydrofluoric (HF) acid. The etching procedure creates openings in selected areas of the silicon dioxide layer and exposes the underlying wafer. The silicon dioxide layer serves as a barrier to dopants that are used for forming a desired device or circuit. As such, removal of selected areas of the silicon dioxide layer forms a mask pattern which enables dopants for forming a desired device or circuit to be diffused into the exposed silicon. Typically, the silicon wafer is divided into a plurality of adjacent die. An IC is then formed in each die, thus enabling large quantities of IC's to be formed simultaneously and batch processed.

Selected dies are tested during the manufacturing process to ensure that various electrical characteristics meet acceptable standards before further processing is completed. Such characteristics include resistance, current gain and voltage breakdown. In order to conduct such in-process testing, selected areas of the silicon dioxide layer are removed to provide access to a selected die for test equipment such as an electrical probe.

Figure 1:
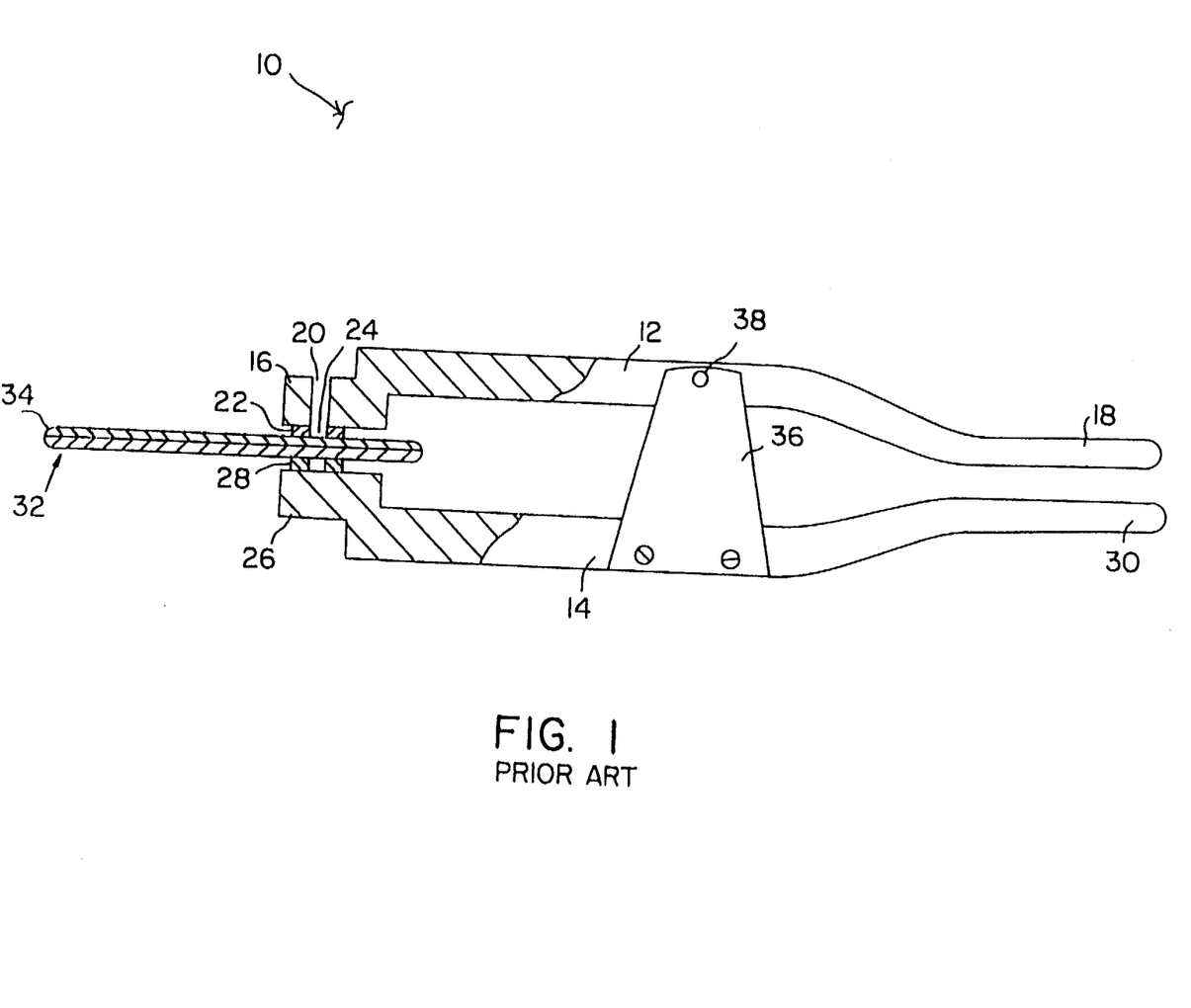
FIG. 1 is a partial cross-sectional view of a prior art clamp device.

A clamp device is utilized to remove each selected area of the silicon dioxide layer. Referring to FIG. 1, a prior art manual clamp device 10 is shown as a partial cross section. The clamp device 10 includes an upper arm 12 and a lower arm 14. The upper arm 12 includes an upper clamping end 16 and an upper handle end 18. The upper clamping end 16 includes a vertical passageway 20 and an upper O-ring 22 having a center hole 24 which is aligned with the vertical passageway 20. The lower arm 14 includes a lower clamping end 26 having a lower O-ring 28 and an lower handle end 30. In use, a wafer 32 having a silicon dioxide layer 34 formed thereon is clamped between the upper 22 and lower 28 O-rings such that the silicon dioxide layer 34 contacts the upper O-ring 22.

In addition, the clamp device 10 includes a pivot member 36 having a pivot pin 38 located in an upper portion of the pivot member 36. The upper arm 12 is rotatably secured to the pivot pin 38. The lower arm 14 is affixed to a lower portion of pivot member 36. As such, the upper arm 12 is able to rotate relative to the lower arm 14.

Consequently, referring to FIG. 1, the application of downward pressure on the upper arm 12 and upward pressure on the lower arm 14 on areas to the left of the pivot pin 38 will cause the upper clamping end 16 to rotate counterclockwise toward the lower clamping end 26. This compresses the upper 22 and lower 28 O-rings against the wafer 32, thus clamping the wafer 32. Consequently, a seal is formed between a selected area on the silicon dioxide layer 34 defined by the upper O-ring 22 and the remaining area on the silicon dioxide layer 34 outside of the selected area. An elastic element (not shown) is affixed to the upper 12 and lower 14 arms and to the left of the pivot pin 38. The elastic element serves to apply the downward and upward pressures described above for clamping the wafer 32. It is noted that the wafer 32 may also be clamped by applying an upward pressure on the upper arm 12 and an opposite downward pressure on the lower arm 14 on areas to the right of the pivot pin 38.

Conversely, the application of downward pressure on the upper 12 arm and upward pressure on the lower arm 14 on areas to the right of pivot pin 38, such as on the upper 18 and lower 30 handles, will cause the upper clamping end 16 to rotate in clockwise direction away from the lower clamping end 26, thus releasing the wafer 32.

In use, the operator visually scans the silicon dioxide layer 34 to locate a predetermined area that is to be etched. The operator then squeezes the upper 18 and lower 30 handles together, separating the upper 16 and lower 26 clamping ends and forming gap for receiving the wafer 32. The operator then positions the selected area on the silicon dioxide layer 34 which is to be etched within center hole 24 of the upper O-ring 22. The upper 18 and lower 30 handles are then released, thus causing the elastic element to rotate the upper clamping end 16 and clamp the silicon wafer 32 such that the upper 22 and lower 28 O-rings are compressed and a seal is formed as described above. A predetermined amount of HF acid is then introduced into the vertical passageway 20 by the operator. The HF acid travels down the vertical passageway 20 to the silicon dioxide layer 34 where the HF acid is collected and contained within the center hole 24 of the upper O-ring 22. This enables etching and the subsequent removal of the silicon dioxide within the selected area.

However, this technique has several disadvantages. A disadvantage is that the elastic element provides insufficient pressure for maintaining suitable compression of the upper O-ring 22. This causes leakage of the HF acid past the upper O-ring 22 and onto the silicon layer 34, resulting in the undesirable removal of silicon dioxide from areas on the silicon dioxide layer 34 outside of the selected area and in ultimate damage to the silicon dioxide layer 34. Consequently, the operator must manually pull the upper 18 and lower 30 handles apart to provide additional compression in order to stop leakage of the HF acid. This compression must then be maintained during the entire etch procedure. This leads to operator fatigue, resulting in leakage of the HF acid and undesirable etching of the silicon dioxide layer 34 as described above.

In addition, as can be ascertained, maintaining the clamp device 10 in an upright position is substantially dependent upon the operator. As such, it is difficult for the operator to hold the clamping device 10 in a stable manner and simultaneously introduce the HF acid into the vertical passageway 20. Consequently, some of the HF acid is frequently spilled on the outside of the upper clamping end 16, which results in the HF acid traveling down the outside of the upper clamping end 16 and onto an area of the silicon dioxide layer 34 outside of the selected area and ultimately causing damage to the silicon dioxide layer 34. In addition, the repetitive nature of this manual technique may possibly lead to the development of muscle strains or physical ailments such as carpal tunnel syndrome and others, thus further diminishing an operator's ability to compress the upper O-ring 22 or to hold the clamp device 10 in a stable manner.

A further disadvantage is that this manual technique is time consuming since the positioning of the selected area within the center hole 24 of the O-ring 22 is largely dependent on operator skill. Moreover, this technique is time consuming since the entire procedure must be repeated for each area which is selected for etching.

SUMMARY OF THE INVENTION

A tool for etching at least one selected area of a silicon dioxide layer on a wafer. The tool includes a container which is partially filled with hydrofluoric (HF) acid. The tool further includes a template having an aperture extending between each selected area and the container. Vapors of the HF acid pass through each aperture to contact and etch each selected area in order to expose a test die on the wafer. An O-ring is associated with each selected area for sealing each of the selected areas from the remaining areas on the silicon dioxide layer such that substantially only the selected areas are etched by the vapors.

An embodiment of the invention sets forth a tool for etching at least one selected area on a wafer. The tool includes a vapor source which provides vapors that are suitable for etching each selected area of the wafer. The tool further includes a template positioned between the wafer and the vapor source. The template includes an aperture extending between each selected area and the vapor source to enable the vapors to pass through each aperture for etching each selected area.

Another embodiment of present invention sets forth a method of etching a selected area of a silicon dioxide layer on a wafer. The method includes exposing the selected area to vapors of an etching solution suitable for etching silicon dioxide for a first selected period of time. In addition, the method includes sealing the selected area such that substantially only the selected area is etched. Moreover, the method includes rinsing the selected area for a second selected period of time to stop the etching.

DETAILED DESCRIPTION OF THE INVENTION

Generally, selected dies are tested during the manufacture of a silicon wafer in order to ensure that various electrical characteristics meet acceptable standards before further processing is completed. Such characteristics include resistance, current gain and voltage breakdown. In accordance with the present invention, separate areas of a silicon dioxide layer formed on a wafer are removed in order to provide access to each selected die for test equipment such as an electrical probe to perform in-process testing. Many types of devices are formed in different locations on a single wafer. In addition, each type of device has a corresponding set of dies which are designated for testing purposes (i.e. test dies). Consequently, the location of the test dies on the wafer varies for each type of device.

The present invention will now be described by referring to the following description in conjunction with FIGS. 2–6 wherein like elements are designated by like reference numerals.

Figure 2:
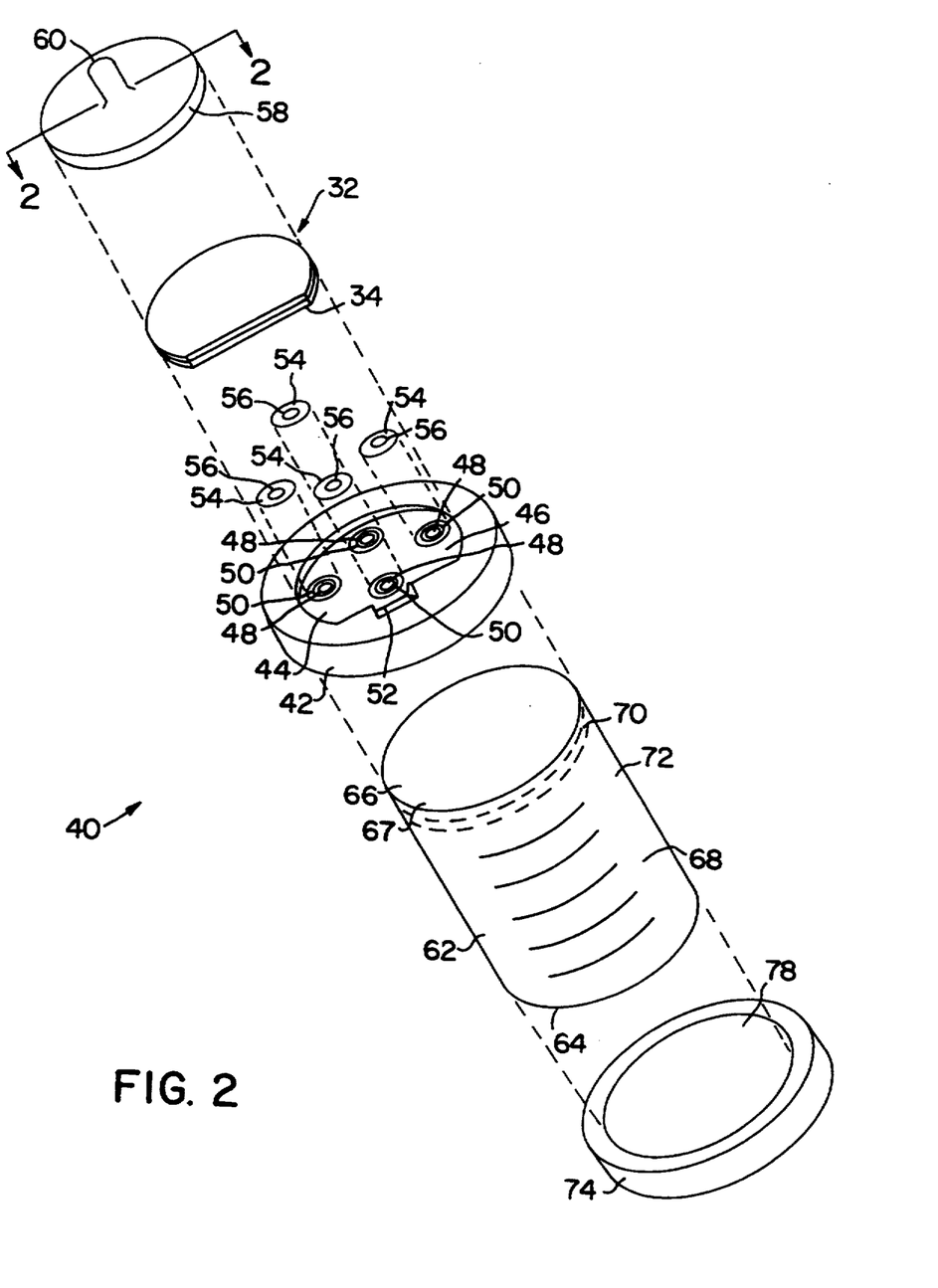
FIG. 2 is an exploded view of an etching tool in accordance with the present invention.

Referring to FIG. 2, a tool 40 for simultaneously etching and removing selected areas of a layer formed on a substrate is shown. For the purposes of this description, the tool 40 is explained in relation to the removal of selected areas of the silicon dioxide layer 34 formed on wafer 32 which includes test dies (not shown). It is noted that other materials, such as silicon nitride and polysilicon, may also be etched by utilizing the present invention. In addition, it is noted that several different layers each fabricated from a different material which may be formed on the wafer 32 may be etched by successively using corresponding etching solutions.

The tool 40 includes a wafer template 42 having a substantially disc shaped configuration and a wafer cavity 44. The wafer cavity 44 is adapted to receive the wafer 32 and includes a bottom surface 46. The bottom surface 46 includes an aperture 48 associated with each test die on the wafer 32. As previously described, the location of the test dies on the wafer 32 varies for each type of device. Thus, the positioning of each aperture 48 on the wafer template 42 also varies for each type of device. By way of illustration, four apertures are shown in FIG. 2 which are equally spaced in a circular arrangement and correspond to the location of a set of test dies on the wafer 32 having a substantially similar configuration. As will be described, use of the wafer template 42 enables simultaneous etching in areas of the silicon dioxide layer 34 corresponding to the location of each test die. The wafer template 42 further includes an O-ring groove 50 formed circularly around each aperture 48.

In addition, the wafer template 42 includes a cutout notch 52. The notch 52 provides access to the wafer 32 when the wafer 32 is positioned within the wafer cavity 44. As such, a tool (not shown) adapted to grasp the wafer 32 such as tweezers may be used to install the wafer 32 into the wafer cavity 44 and to remove the wafer 32 from the wafer cavity 44.

The tool 40 further includes an O-ring 54 associated with each aperture 48. Each O-ring 54 has an annular configuration and includes a center hole 56. Each O-ring 54 is positioned between the wafer template 42 and the silicon dioxide layer 34 on the wafer 32. As will be described, each O-ring 54 serves to seal a selected area on the silicon dioxide layer 34 essentially within each hole 56 from the remaining area on the silicon dioxide layer 34. Furthermore, each O-ring 54 is fabricated from an elastomeric material having sealing properties when placed in contact with a relatively smooth surface and which does not substantially degrade when exposed to an etching solution.

Additionally, the tool 40 includes a disc shaped template cover 58 having an upstanding stem 60. The template cover 58 serves to load and displace the wafer 32 such that a seal is formed between each O-ring 54 and the silicon dioxide layer 34. The stem 60 may be grasped by an operator in order to place the template cover 58 on the wafer 32 as desired and for removal therefrom.

Furthermore, the tool 40 includes a cylindrically shaped container 62 having a closed end 64 and open end 66. The container 62 includes a hollow 67 which serves to hold a predetermined amount of an etching solution (not shown) which is received through the open end 66. By way of example, etching solutions which may be utilized include hydrofluoric (HF) acid, which may be used to etch silicon dioxide, phosphoric acid, which may be used to etch silicon nitride and potassium hydroxide, which may be used to etch polysilicon. The container 62 is fabricated from a material suitable for holding the etching solution that is utilized. By way of example, a material suitable for holding HF acid is polyvinylidene fluoride (PVDF), which is manufactured by PENNWALT and sold under the trademark KYNAR. In addition, the container 62 may include graduations 68 for indicating the amount of etching solution that is present within the container 62. The container 62 further includes external threads 70 formed on an external surface 72 of the container 62 near the open end 66.

The tool 40 further includes a holding ring 74 having an annular ring configuration. The ring 74 includes an inner bore 78 which is adapted to fit around the container 62. The ring 74 provides a broad base which serves to enhance the stability of the container 62 while the container 62 is in the upright position to substantially reduce the occurrence of spills due to accidental overturning of the container 62.

Figure 3:
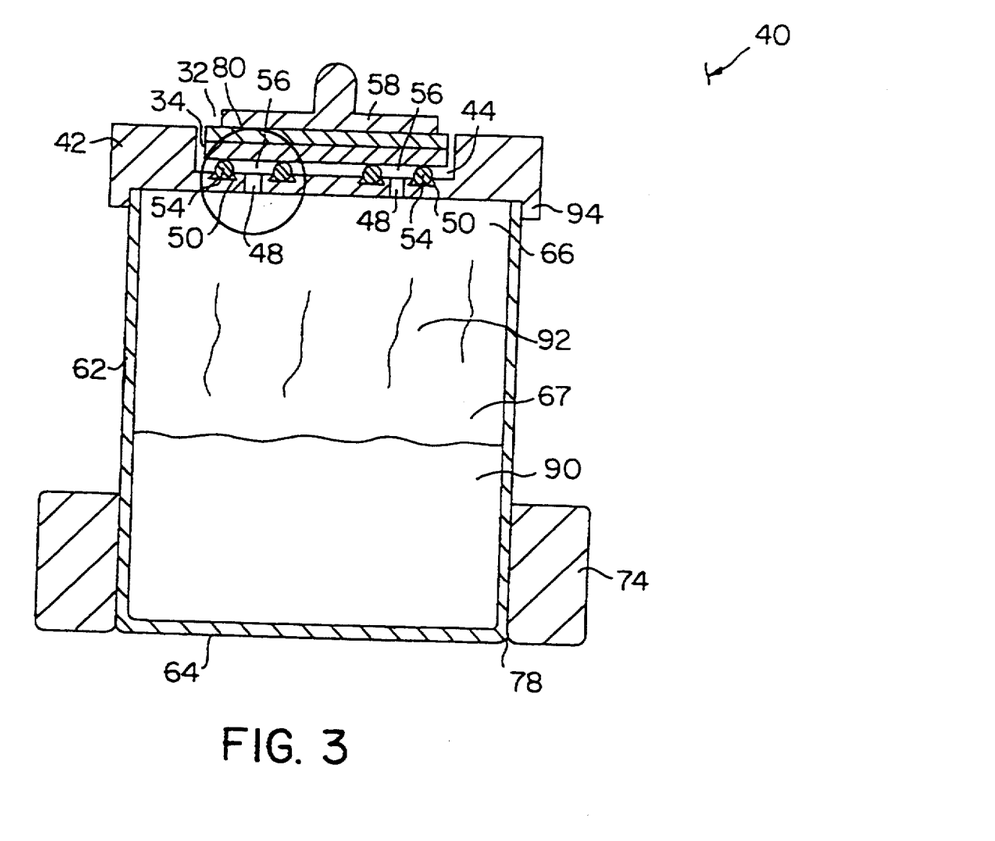
FIG. 3 is an assembled cross-sectional view of the etching tool along line 1—1 of FIG. 2.

Referring to FIG. 3 in conjunction with FIG. 2, a cross-sectional view of the tool 40 and the wafer 32 is shown along section line 1—1 of FIG. 2. FIG. 3 illustrates the tool 40 in an assembled configuration. The wafer template 42 is positioned on the open end 66 of the container 62. The wafer 32 is positioned within the wafer cavity 44 such that the silicon dioxide layer 34 faces downward and contacts each O-ring 54. Each O-ring 54 is positioned in an associated groove 50 between the wafer template 42 and the silicon dioxide layer 34 of the wafer 32. In addition, each aperture 48 is located within each hole 56.

Figure 4:
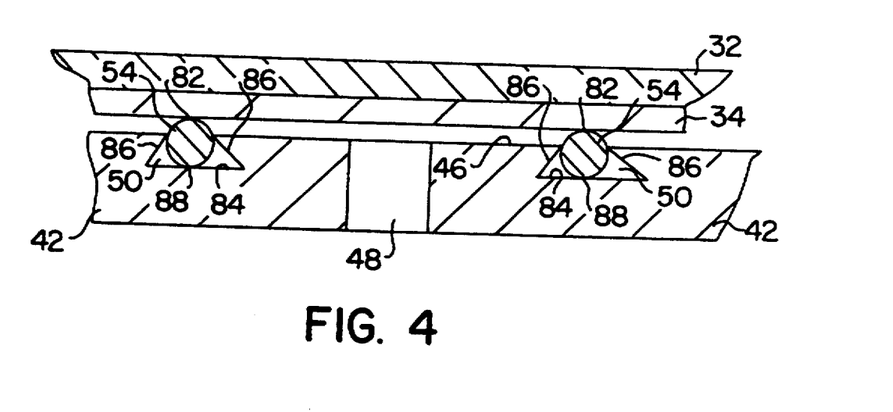
FIG. 4 is an enlarged view of balloon section 35 of FIG. 3.

Referring to FIG. 4 in conjunction with FIG. 3, an exemplary O-ring 54 and groove 50 combination is shown. FIG. 4 is an enlarged view of balloon section 80 of FIG. 3. The silicon dioxide layer 34 contacts top portions 82 of the O-ring 54. Groove 50 is formed in the wafer template 42 and includes a horizontal mounting surface 84 positioned between a pair of sloping sidewalls 86. The sidewalls 86 slope upwardly toward each other and terminate at the bottom surface 46 of the wafer cavity 44. The sidewalls 86 are spaced apart such that the O-ring 54 fits snugly within the sidewalls 86 for retaining the O-ring 54 in groove 50. Bottom portions 88 of O-ring 54 contact mounting surface 84 of groove 50. As such, a seal is formed between the top portions 82 and the silicon dioxide layer 34 and between the bottom portions 88 and the mounting surface 84. Consequently, the area on the silicon dioxide layer 34 between the top portions 82 are sealed from the remaining area on the silicon dioxide layer 34, thus defining the area of the silicon dioxide layer 34 which is etched. The wafer 32 is oriented such that a selected area of the silicon dioxide layer 34 which corresponds to a test die is located between the top portions 82 of the O-ring 54. This seals the selected area from the remaining area on the silicon dioxide layer 34. In addition, aperture 48 is located between top portions 82 and extends through the wafer template 42.

Figure 5:
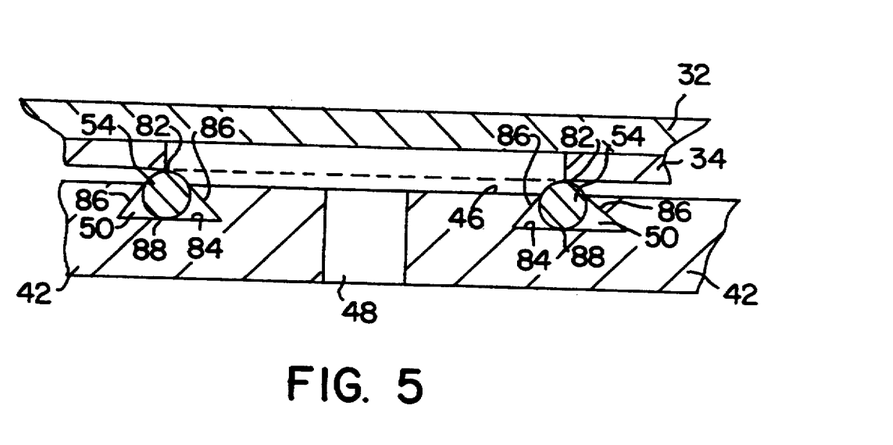
FIG. 5 is an enlarged view of balloon section 35 of FIG. 3 showing an etched portion of a silicon dioxide layer.

Referring back to FIG. 3, the hollow 67 is partially filled with a predetermined amount of an etching solution 90 such as HF acid. As such, vapors 92 are emitted from the etching solution 90 which travel upward in the hollow 67 toward the wafer template 42 and through each aperture 48. Consequently, the selected areas on the silicon dioxide layer 34 wherein etching and removal of silicon dioxide is desired are in fluid communication with the vapors 92 emitted by the etching solution. This results in the simultaneous removal of silicon dioxide in the selected areas of the silicon dioxide layer 34 located between the top portions 82 of each O-ring 54. Referring to FIG. 5, a selected area on the silicon dioxide layer 34 between top portions 82 is shown etched and removed. FIG. 5 is an enlarged view of balloon section 80 of FIG. 3 and shows the removed section of the silicon dioxide layer 34 as a dashed line. As previously described, this provides access and enables testing of test dies for electrical characteristics.

During the formation of the silicon dioxide layer 34 on the wafer 32 surface curvatures (not shown) are typically formed that render the surface of the silicon dioxide layer 34 relatively uneven. Consequently, the top portions 82 of each O-ring 54 may not be in full contact with the silicon dioxide layer 34 and a seal between the silicon dioxide layer 34 and the top portions 82 of the O-ring 54 may not be formed. A wafer is typically thin in cross-section and relatively flexible when subjected to a load. Referring back to FIG. 3, the template cover 58 is shown positioned on the wafer 32. The template cover 58 is of sufficient weight to displace the wafer 32 such that the top portions 82 of each O-ring 54 are in full contact with the silicon dioxide layer 34 to form a seal as previously described.

In use, the silicon dioxide layer 34 is exposed to the vapors 92 for a first predetermined time period sufficient to simultaneously etch and remove the silicon dioxide from the selected areas. It has been found in preliminary trials that approximately one and one-half minutes is a suitable time period for etching silicon dioxide utilizing this method. Upon completion of this process, the template cover 58 and wafer 32 are removed. Subsequently, the wafer 32 is rinsed in deionized water for a second predetermined time period in order to remove substantially all of any remaining HF acid residue. This serves to prevent further etching and removal of the silicon dioxide layer 34 in surrounding areas outside of each O-ring 54. It has been found that approximately two minutes is a sufficient time period for rinsing with deionized water to remove residual HF acid. The wafer 32 is then dried in a conventional wafer drying device.

The wafer template 42 further includes a flange 94 which extends downwardly from the wafer template 42. The flange 94 includes internal threads (not shown) located on an internal surface of the flange 94. The internal threads are adapted to engage with the external threads 70 of the container 62 for securing the wafer template 42 to the container 62. As such, the wafer template 42 remains secured to the container 62 if the container 62 is accidentally overturned, thus substantially reducing the amount of etching solution that is spilled.

The container 62 is positioned within the inner bore 78 of the ring 74. The closed end 64 of the container 62 has a flat configuration to enable the container 62 to stand in an upright position. As previously described, the ring 74 serves to enhance the stability of the container 62 while in the upright position and to substantially reduce the occurrence of spills due to accidental overturning of the container 62.

Figure 6:
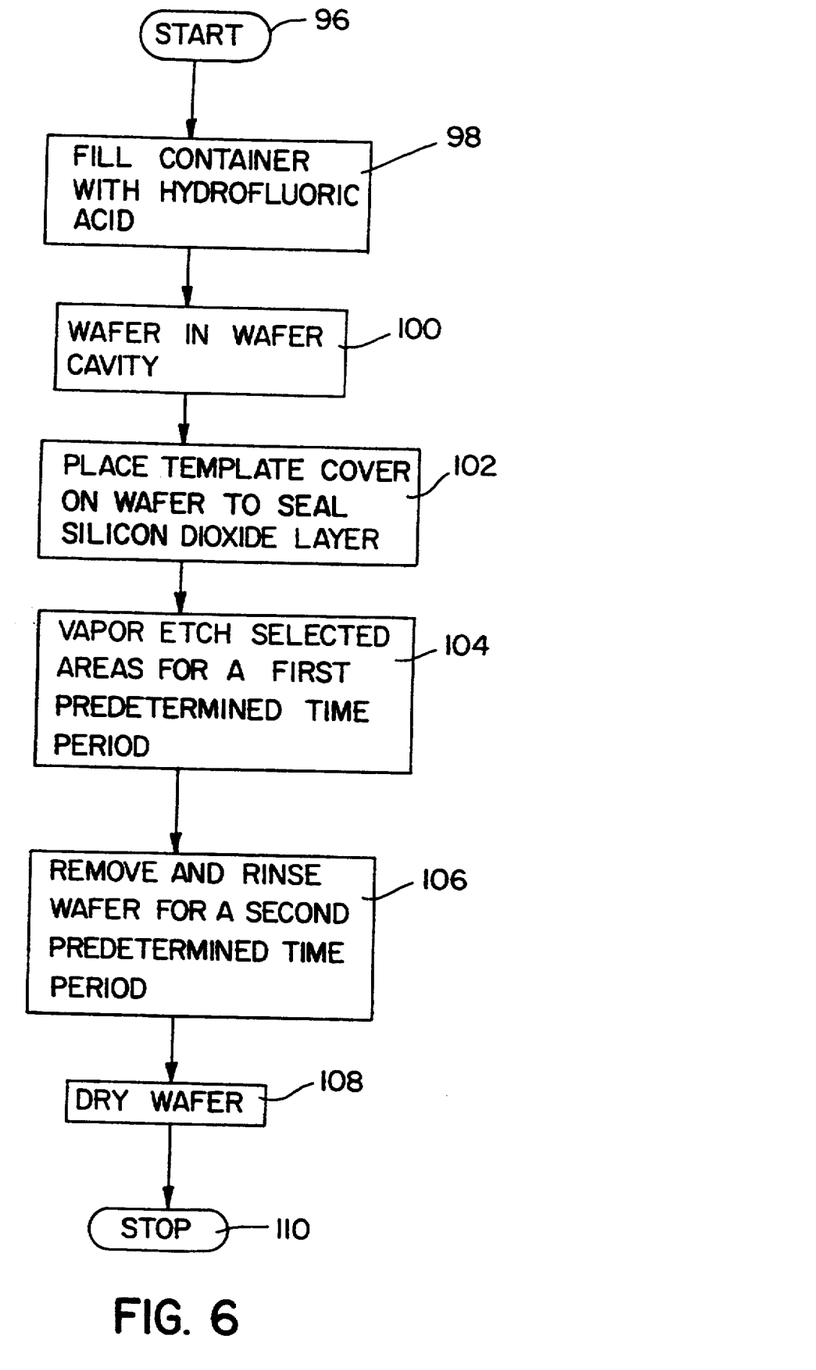
FIG. 6 is a flow diagram depicting a method for etching a silicon dioxide layer formed on a wafer.

Referring to FIG. 6 in conjunction with FIG. 3, a process flow chart for vapor etching the silicon dioxide layer 34 on wafer 32 is shown. Before starting 96 the process, a wafer template 42 is selected having a desired aperture 48 pattern which corresponds to the set of test dies on the wafer 32. In addition, each O-ring 54 is positioned in an associated groove 50. Referring to step 98, the hollow 67 is partially filled with HF acid 90 through the open end 66. As such, vapors 92 are emitted which travel upward within the hollow 67. At step 100, the wafer 32 is placed within the wafer cavity 44 such that the silicon dioxide layer 34 faces downward and contacts each O-ring 54. The wafer template 42 is then secured to the open end 66. At step 102, the template cover 58 is placed on the wafer 32 in order to displace the wafer 32 and provide full contact between the top portions 82 and the silicon dioxide layer 34 as previously described. At step 104, the vapors 92 travel through each aperture 48 and etch each selected area of the silicon dioxide layer 34 for a first predetermined amount of time to expose each test die. At step 106, wafer template 58 and wafer 32 are removed and the wafer 32 is rinsed with deionized water for a second predetermined amount of time in order to remove any residual HF acid on the wafer 32 or the silicon dioxide layer 34. At step 108, the wafer 32 is dried in a conventional drying device and the process is subsequently completed 110.

It is noted that many alternatives of the present invention are possible. An alternative is that sealing devices having oval or rectangular shapes may be used instead of O-rings. A further alternative is that other types of sealing devices may be used such as metal gaskets. In addition, it is noted that a spring mechanism may be used to load the wafer rather than a weighted template cover. Furthermore, the ring may be integrally formed with the container.

Thus it is apparent that the present invention satisfies the objectives, aim and advantages set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A tool for etching at least one selected area on a wafer, comprising:
   vapor means for providing vapors of an etching solution wherein said vapors are adapted for etching each said selected area;
   a template positioned between said wafer and said vapor means, said template having an aperture extending between each said selected area and said vapor means to enable said vapors to pass through each said aperture for etching each said selected area;
   sealing means for sealing said selected area; and
   a cover for displacing said wafer against said sealing means for providing full contact between said wafer and said sealing means such that only said selected area is etched by said vapors.

2. The tool according to claim 1, wherein said sealing means includes an O-ring positioned between said template and said wafer.

3. The tool according to claim 1, wherein said wafer includes a silicon dioxide layer and said selected area is located on said silicon dioxide layer.

4. The tool according to claim 1, wherein said etching solution is hydrofluoric acid.

5. The tool according to claim 1, wherein said sealing means includes an O-ring groove.

6. A tool for etching a plurality of selected areas on a wafer, comprising:
   a container suitable for holding an etching solution, wherein said etching solution provides vapors adapted for etching each of said selected areas;
   a template positioned between said wafer and said container, said template having an aperture extending between each of said selected areas and said container to enable said vapors to pass through each said aperture for etching each of said selected areas;
   an O-ring associated with each of said selected areas, wherein each said O-ring is positioned between said template and said wafer for sealing each of said selected areas; and
   a cover for displacing said wafer against each said O-ring for providing full contact between said wafer and each said O-ring such that only said selected areas are etched by said vapors.

7. The tool according to claim 6, wherein said wafer includes a silicon dioxide layer and each of said selected areas are located on said silicon dioxide layer.

8. The tool according to claim 6, wherein said etching solution is hydrofluoric acid.

9. The tool according to claim 6, wherein said template includes an O-ring groove for holding each said O-ring.

10. A tool for etching a plurality of selected areas on a silicon dioxide layer formed on a silicon wafer to expose a test die at each of said selected areas, comprising:
    a container partially filled with a amount of hydrofluoric acid, wherein said hydrofluoric acid emits vapors which travel upward in said container;
    a template positioned between said wafer and said container, said template having an aperture between each said of said selected areas and said vapors;
    an O-ring associated with each said aperture, each said O-ring having a center hole, wherein each said O-ring is positioned between said silicon dioxide layer and said template such that each said aperture is located within said center hole of each said associated O-ring;
    a template cover for displacing said wafer and said silicon dioxide layer against each said O-ring for providing full contact between each said O-ring and said silicon dioxide layer to form a seal such that only said selected areas are etched;
    an annular ring having a central bore adapted to fit around said container.

11. A tool for etching a plurality of selected areas on a wafer, comprising:
    vapor means for providing vapors of an etching solution wherein said vapors are adapted for etching each of said selected areas; and a template positioned between said wafer and said vapor means, said template having an aperture extending between each of said selected areas and said vapor means to enable said vapors to pass through each said aperture to enable simultaneous etching each of said selected areas.

12. The tool according to claim 11, further including a seal for sealing each of said selected areas such that only each said selected area is etched by said vapors.

13. The tool according to claim 12, wherein said seal includes an O-ring associated with each of said selected areas, wherein each said O-ring is positioned between said template and said wafer.

14. The tool according to claim 12, wherein said sealing means includes a cover for displacing said wafer against said sealing means for providing full contact between said wafer and said sealing means such that only said selected area is etched by said vapors.

15. A tool for etching at least one selected area on a wafer, comprising:

vapor means for providing vapors of an etching solution wherein said vapors are adapted for etching each said selected area;

a template positioned between said wafer and said vapor means, said template having an aperture extending between each said selected area and said vapor means to enable said vapors to pass through each said aperture for etching each said selected area simultaneously;

a seal for sealing each said selected area; and a cover for displacing said wafer against each said seal for providing full contact between said wafer and each said seal such that only each said selected area is etched by said vapors.

16. The tool according to claim 15, wherein said seal is an O-ring positioned between said template and said wafer.

17. The tool according to claim 15, wherein said seal includes an O-ring groove.

* * * * *